(12) United States Patent
Hathcock et al.

(10) Patent No.: US 6,613,981 B1
(45) Date of Patent: Sep. 2, 2003

(54) PIVOTABLE CABLE RING WIRE MANAGEMENT SYSTEM

(75) Inventors: Mary H. Hathcock, New Bern, NC (US); J. Wyman Kinlaw, Greenville, NC (US); Michael J. Hill, New Bern, NC (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 10/273,224

(22) Filed: Oct. 17, 2002

Related U.S. Application Data

(60) Provisional application No. 60/330,001, filed on Oct. 17, 2001.

(51) Int. Cl.[7] .............................................. H01B 7/06
(52) U.S. Cl. ..................... 174/69; 174/72 A; 174/100; 248/68.1; 248/74.1; 361/826
(58) Field of Search ................................ 174/48, 49, 68.3, 174/69, 72 A, 100, 101; 248/65, 68.1, 71, 74.1; 361/826

(56) References Cited

U.S. PATENT DOCUMENTS

| | | | | |
|---|---|---|---|---|
| 3,659,319 A | * | 5/1972 | Erickson | ..................... 248/74.1 |
| 4,614,383 A | * | 9/1986 | Polley et al. | .................. 174/69 |
| 5,996,944 A | * | 12/1999 | Daoud | ........................ 248/68.1 |
| 6,161,803 A | * | 12/2000 | Daoud | ........................ 248/68.1 |
| 6,220,554 B1 | * | 4/2001 | Daoud | ........................ 248/74.1 |
| 6,305,556 B1 | * | 10/2001 | Mayer | ........................ 361/826 |
| 6,326,547 B1 | * | 12/2001 | Saxby et al. | .................. 174/69 |
| 6,327,139 B1 | * | 12/2001 | Champion et al. | ............ 174/69 |
| 6,427,952 B2 | * | 8/2002 | Caveney et al. | ........... 248/68.1 |

* cited by examiner

Primary Examiner—Dean A. Reichard
Assistant Examiner—Adolfo Nino
(74) Attorney, Agent, or Firm—Kennedy Covington Lobdell & Hickman, LLP

(57) ABSTRACT

A pivotable cable ring management system for moveably supporting wires on a stationary support structure, the wire management system comprising a mounting member pivotably attachable to a stationary support structure and at least one retention bracket extending from the mounting member, the retention bracket including a substantially circularly-shaped cable ring having two oppositely-facing open sides for accommodating the routing of wires therethrough, a base portion including at least one planar surface for mounting the cable retention bracket to the support structure, and at least one ring section, which includes an inner surface for facing the wires and for making contact therewith, for retaining wires, wherein at least part of the inner surface is convexly curved from one open side of the retention bracket to the other.

10 Claims, 6 Drawing Sheets

PIVOTABLE CABLE RING WIRE MANAGEMENT SYSTEM

CROSS-REFERENCE TO RELATED APPLICATION

This application is entitled to the benefit of, and claims priority to, provisional U.S. patent application Ser. No. 60/330,001 filed Oct. 17, 2001 and entitled "PIVOTABLE CABLE RING WIRE MANAGEMENT SYSTEM," the entirety of which is hereby incorporated by reference.

BACKGROUND OF THE PRESENT INVENTION

1. Field of the Present Invention

The present invention relates generally to the field of wire management systems for electrical component racks, and more particularly to the field of multi-positional mounting members for electrical component racks utilizing moveable retention brackets or rings for securely retaining wires or cables therein.

2. Background Art

As is well known, electrical component racks are frequently utilized to store computer equipment and other electrical equipment of a variety of types. The various components are mounted on or in such racks in close proximity to one another and connected together by cables, wires, or the like, collectively referred to herein as "wires."

Apparatuses for routing wires within and through the electrical component racks are likewise well known. In particular, a number of such apparatuses have utilized a plurality of rings or similar retention brackets installed in advantageous locations in a given rack, or attached to an elongated mounting member which may installed in a desired location in the rack. Wires may then be held in place on the rack by routing them through the interiors of the respective rings or retention brackets. In order to facilitate simple insertion and removal of wires from the respective rings, a gap commonly exists in the body of each ring, thus connecting the interior of the respective ring or retention bracket to its exterior. Unfortunately, not only does the gap permit wires to be inserted into the ring or retention bracket interior, but it permits wires to escape as well. Thus, retention brackets making use only of fingerlike projections extending toward each other from opposite sides of the mounting member have large gaps which provide only minimal retention properties in the area of the gap.

One solution to this problem is to use D-shaped rings which have a very narrow gap at one corner of the "D". However, many prior art D-rings are rigid structures having fixed gaps which permit only a single wire having a cross-section smaller than the gap to be inserted into the interior at a time, thus limiting the size of wire which may be routed through the D-ring and requiring bundles of wires to be separated in order to install them within the interior of the D-ring. Other prior art D-rings are more flexible and may be bent outward by hand, thus widening the gap, to accommodate the insertion of wires. Unfortunately, the weight or other forces placed on the rings by the wires is usually directed in the same outward direction, and at the same point on the rings, as the force placed on the rings manually during wire insertion. The forces placed on the rings by the wires are frequently enough to bend the rings by themselves, thus widening the gap enough to allow the wires to escape. Thus, a need exists for a ring which is rigid enough to withstand the forces placed on it by the wires it surrounds but which is capable of providing a gap large enough to facilitate the insertion of bundles of wires.

A further problem arises with retention brackets which must be temporarily moved from one location to another. Once installed, many wires are disposed statically in that they are not moved out of their initial installed positions or locations unless they are being uninstalled. However, it is frequently advantageous for a wire or collection of wires to be easily moveable from one location to another in order to allow access to a particular area of a rack, to enable wire connections to be made more easily, to maintain a particular physical disposition between the wires and the equipment to which they are connected, or the like. One solution to this problem is to attach retention brackets to a mounting member which is pivotable relative to a stationary support structure. Unfortunately, prior art retention brackets also tend to rotate the wires retained therein as well, and this tends to twist and otherwise stress the wires each time the retention brackets are moved.

A further problem with prior art retention brackets involves those surfaces of the brackets which make contact with the wires retained therein. These surfaces, which are typically the inwardly-facing surfaces of the brackets, are typically flat or planar in shape, with minimal curvature at their edges. Thus, wires installed and retained within the brackets are often bent sharply around the edges of the inwardly-facing surfaces. When industry-standard curvature or "bend" requirements or recommendations for wires are not met, there is a much greater risk of damage being done to the wires, either by bending the wires so sharply that they are damaged or through the friction caused by the sharp edges of the retention brackets on the outside surfaces of the wire. Unfortunately, prior art retention brackets generally make no provision for these bend requirements or recommendations.

Some prior art retention brackets are believed to be formed from ring sections whose cross-sections are generally round, although they are not known to be formed to take into consideration the above-described "bend" requirements. Ring sections having round, uniform cross-sections are relatively easy to design and manufacture, and thus they are used for a variety of purposes. However, in order to rigidly attach a retention bracket to a mounting member, it is frequently advantageous for the retention bracket to include one or more flat surfaces which may be abutted against the mounting member to provide a stable interface. Unfortunately, ring sections having entirely round cross-sections do not include such flat mounting surfaces. Further, the ring sections of retention brackets must frequently be twisted in order to install wires therein, but must be subsequently able to return to their original shape in order to retain those wires. At the same time, the ring sections must be rigid enough to withstand the twisting forces placed on them by the wires. Unfortunately, ring sections having entirely round cross-sections are typically not capable of meeting these requirements. Thus, a need exists for a retention bracket having convex inner surfaces for safely guiding wires coupled with flat mounting surfaces for mounting the retention bracket to a support structure while at the same time providing the necessary structural strength to reliably retain the wires therein.

SUMMARY OF THE PRESENT INVENTION

Briefly summarized, the present invention relates to a pivotable cable ring wire management system for an electrical component rack which utilizes one or more round cable rings in order to securely retain wires or cables therein. Broadly defined, the pivotable cable ring wire management system according to one aspect of the present invention includes: a mounting member pivotably attachable to a stationary support structure, and at least one retention bracket extending from the mounting member, the retention bracket including a substantially circularly-shaped cable ring.

In features of this aspect, the mounting member is pivotable relative to the stationary support structure about an axis of rotation, the circular shape of the cable ring defines a central axis, and the axis of rotation and the central axis are generally parallel; the axis of rotation and the central axis are both generally vertical; the mounting member is pivotable relative to the stationary support structure about an axis of rotation, and the cable ring extends from the mounting member in a direction substantially perpendicular to the axis of rotation; the mounting member is pivotable relative to the stationary support structure about an axis of rotation, the cable ring defines a generally cylindrical interior defining a central axis, and the axis of rotation and the central axis are generally parallel; the mounting member is a swinging structure attached by hinges to the stationary support structure; the system further includes a swinging structure attached by hinges to the stationary support structure, and the mounting member is attached to the swinging structure; the stationary support structure is a stationary frame assembly, the swinging structure is a gate frame, and the stationary support structure and the gate frame are for supporting at least one electrical component and at least one wire; the cable ring includes two arcuate ring sections discontinuous from each other at a separation point; and some of the surfaces of the ring section face inward, and the inward-facing surfaces of the ring section are convexly shaped.

The present invention also includes a method for repositioning a plurality of wires relative to a stationary support structure, wherein the method includes: supporting a circular retention bracket on a mounting member; positioning a plurality of wires in the circular retention bracket in a wire arrangement, the wire arrangement defining an angular orientation; and pivoting the mounting member relative to the stationary support structure such that the wire arrangement is moved relative to the stationary support structure while preserving the angular orientation of the wire arrangement.

In features of this aspect, the step of pivoting the mounting member relative to the stationary support structure includes rotating the circular retention bracket around the wire arrangement without rotating the wires; the circular retention bracket defines a central axis, and the step of rotating the circular retention bracket around the wire arrangement without rotating the wires includes rotating the circular retention bracket without rotating the wires relative to the central axis; the step of pivoting the mounting member relative to the stationary support structure includes rotating the circular retention bracket around the wire arrangement without substantially disturbing the wire arrangement; the circular retention bracket defines a central axis, and the step of pivoting the mounting member relative to the stationary support structure includes moving the wire arrangement in an arcuate direction without rotating the wires relative to the central axis; the step of positioning a plurality of wires in the circular retention bracket includes the steps of twisting at least one section of the circular retention bracket to open a gap in the circular retention bracket and maneuvering at least one of the wires through the gap; and the method further includes bending the wires around a convexly-curved surface of the circular retention bracket.

In another aspect of the present invention, a cable retention bracket for a wire management system has two oppositely-facing open sides for accommodating the routing of wires therethrough, and the cable retention bracket includes: a base portion having at least one planar surface for mounting the cable retention bracket to a support structure; and at least one ring section, which includes an inner surface for facing the wires and for making contact therewith, for routing wires, wherein at least part of the inner surface is convexly curved from one open side of the retention bracket to the other.

In features of this aspect, at least one outer surface of the ring section faces away from the wires, and at least a portion of at least one outer surface is flat from one open side of the retention bracket to the other open side of the retention bracket; the ring section has an H-shaped cross-section formed by two generally parallel side elements and one central cross element connecting the two side elements together, and at least one side element of the H-shaped cross-section is convexly curved from one end to the other; the ring section and base portion are integrally formed; the planar surface of the base portion is an outer surface disposed to face away from wires, and the planar surface is disposed generally adjacent to a convexly-curved inner surface of the ring section; the ring section and the base portion together have an H-shaped cross-section formed by two side elements and one central cross element, and at least one side element of the H-shaped cross-section is convexly curved from one end to the other; the base portion further includes an inner surface for facing the wires and for making contact therewith, and at least part of the inner surface is convexly curved from one open side of the retention bracket to the other open side of the retention bracket; the base portion has an H-shaped cross-section formed by two generally parallel side elements and one central cross element connecting the two side elements together, and at least one side element of the H-shaped cross-section is convexly curved from one end to the other; all of the inner surfaces of the ring section are convex from one open side of the retention bracket to the other open side of the retention bracket; the ring section is a first ring section and the cable retention bracket further comprises a second ring section having an inner surface for facing the wires and for making contact therewith, wherein at least part of the inner surface of the second ring section is convex from one open side of the retention bracket to the other; the convexity includes substantially uniform curvature from one open side of the retention bracket to the other; the retention bracket is substantially circular in shape; the outwardly-facing surfaces of the retention bracket are collectively generally cylindrical in shape; and the base portion includes a tab, which includes a plurality of flat surfaces, extending generally away from the ring section for mounting the cable retention bracket to a support structure.

In yet another aspect of the present invention, a swing-gate type mounting rack for supporting at least one electrical component and at least one wire includes: a stationary frame assembly; a gate frame, attached to the stationary frame assembly, which is pivotable relative to the stationary frame assembly about a substantially vertical axis of rotation; and a circular cable ring, extending from the gate frame, which defines a substantially vertical central axis.

In features of this aspect, the central axis defined by the circular cable ring remains substantially vertical while the gate frame and the cable ring are rotated relative to the stationary frame assembly; the cable ring includes two oppositely-facing open sides for accommodating the routing of wires therethrough, the cable ring includes an inner surface disposed to face and make contact with wires retained therein, and at least part of the inner surface is convex from one open side of the retention bracket to the other open side of the retention bracket; and the stationary frame assembly is adapted to be attached to a wall.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
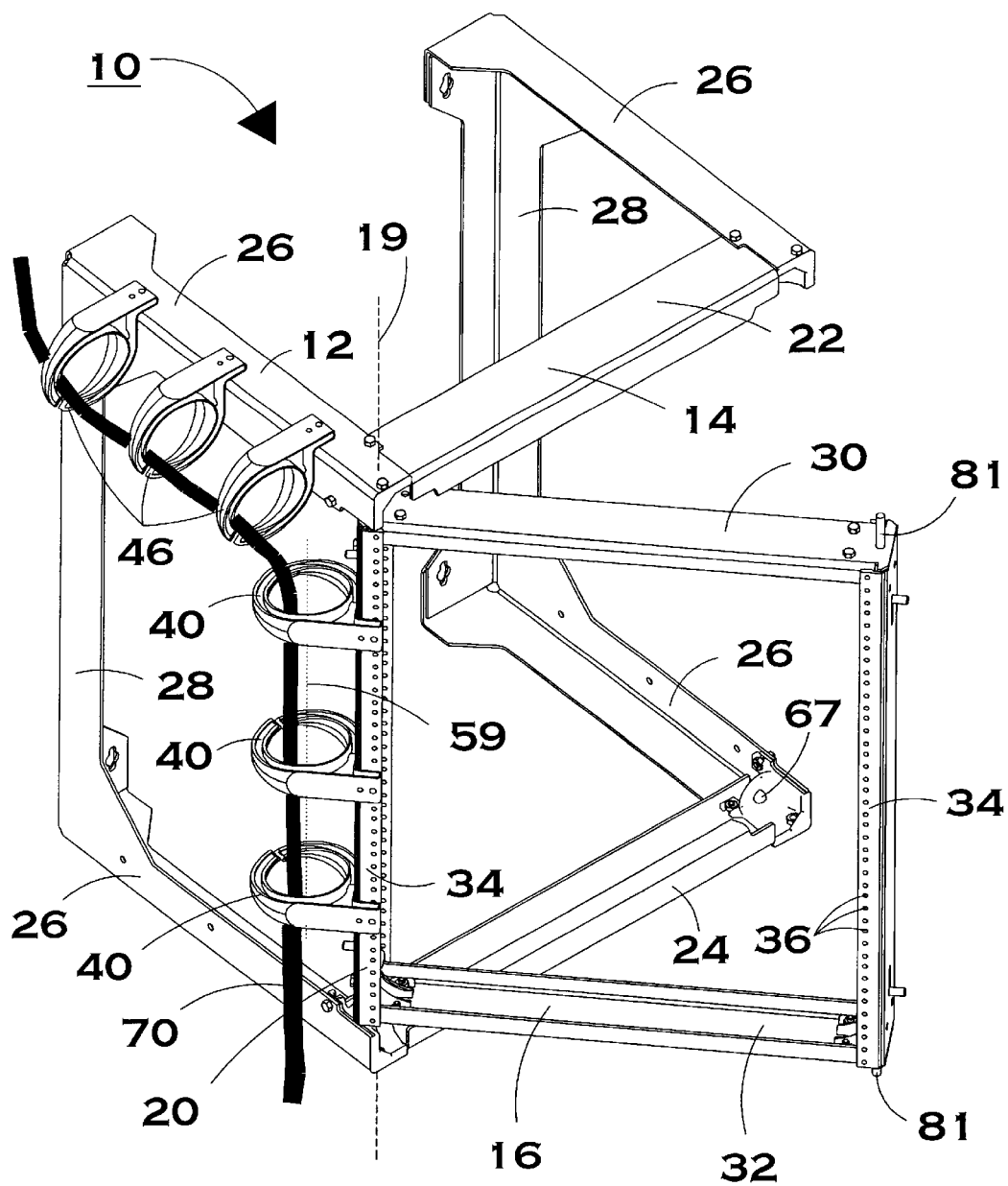
FIG. 1 is a perspective view of a pivotable cable ring wire management system in an open position in accordance with the present invention.

FIG. 1 shows a pivotable cable ring wire management system in accordance with the preferred embodiments of the present invention. The system includes a pivotable mounting member 20 and one or more retention brackets 40. The mounting member 20 may be a separate mounting bracket similar to the one described in the commonly-assigned U.S. patent application Ser. No. 09/803,313, the entirety of which is incorporated herein by reference, or it may be an integral member of a rack, frame or cabinet 10 (generally referred to hereinafter as "racks"). The mounting member 20 is pivotably attached to a stationary support structure 12, which may be an integral portion of the same rack 10 or may be a separate structure.

FIG. 1 illustrates a wall-mounted embodiment of the present invention, although it will be understood that many other arrangements are likewise possible without departing from the scope of the present invention. The wall mounted rack 10 shown is of the well-known swing-gate type and includes a stationary frame assembly 14 attachable to a wall and a pivoting gate frame 16 mounted thereon. The stationary frame assembly 14 includes a top front member 22, a bottom front member 24, four side horizontal members 26 and a pair of back members 28. The gate frame 16 includes a top member 30, a bottom member 32, and a pair of side members 34. Each side member 34 of the gate frame 16 is formed with mounting apertures 36 regularly spaced along its front and rear surfaces, thus permitting electronic components and accessories, such as cable rings and the like, to be mounted thereon. The rack 10 further includes pivoting means for pivotably attaching the gate frame 16 to the stationary frame assembly 14. One pivoting means suitable for use with the present invention is a pin 81 extending vertically from each of the top and bottom members 30, 32 of the gate frame 16 to mate with a corresponding pin receptacle 67 disposed in the top and bottom front members 22, 24 of the stationary frame assembly 14. With an upper and a lower pin 81 each residing in a corresponding receptacle 67, the entire gate frame 16 may be pivoted open upon the pin 81. A pin and pin receptacle suitable for use with the present invention are disclosed in a co-pending and commonly-assigned patent application entitled "RAMPED LATCH CLOSURE SYSTEM."

As illustrated in FIG. 1, the stationary support structure 12 may be the stationary frame assembly 14, and the mounting member 20 may be one of the side members 34 of the gate frame 16. Pivoting retention brackets 40 are installed along the mounting member 20, which may be rotated relative to the stationary frame assembly 14 about an axis of rotation 19. Thus, the retention brackets 40 are also allowed to rotate relative to the stationary frame assembly 14 with the rotation occurring about the same axis of rotation 19. However, it should be obvious that the mounting member 20 may instead be a separate member which may be attached to a gate frame 16 in a swing-gate type rack 10, and that the stationary support structure 12 may instead be a separate member to which a mounting member 20 may be directly attached. In addition, stationary retention brackets 46 of similar or varying construction may also be installed elsewhere on the rack 10, although their design is not as important as those which are to rotate.

Figure 2:
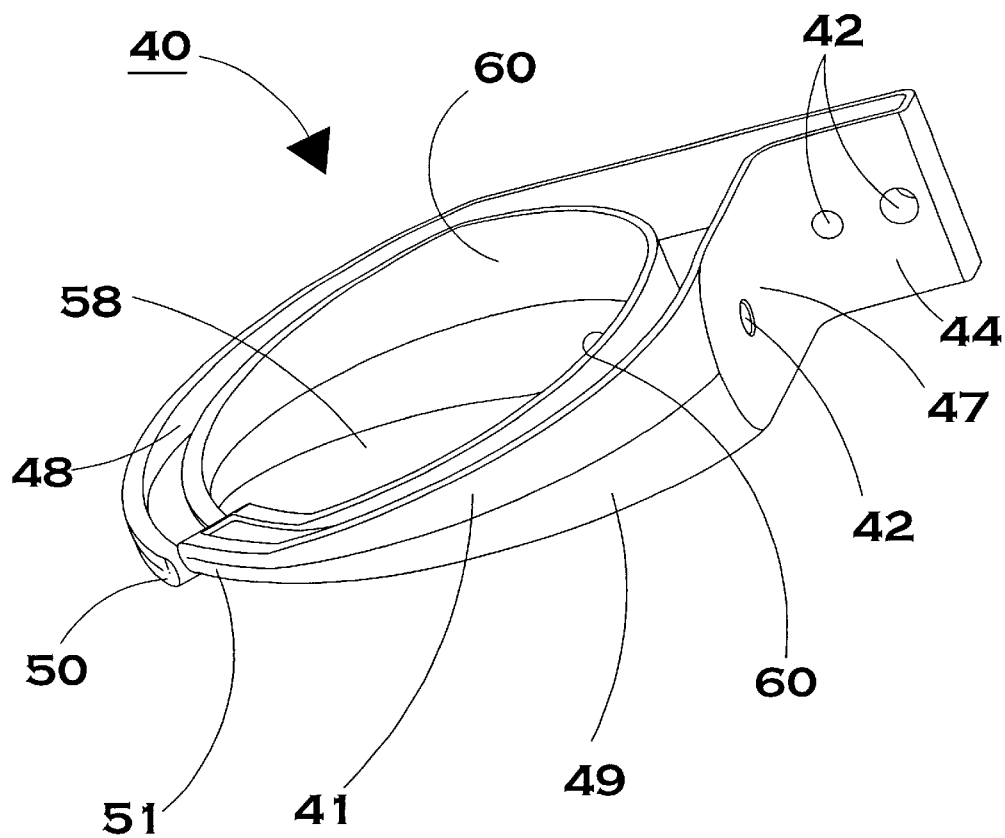
FIG. 2 is a rear perspective view of a cable ring for use with the pivotable cable ring wire management system of FIG. 1.
Figures 3, 4:
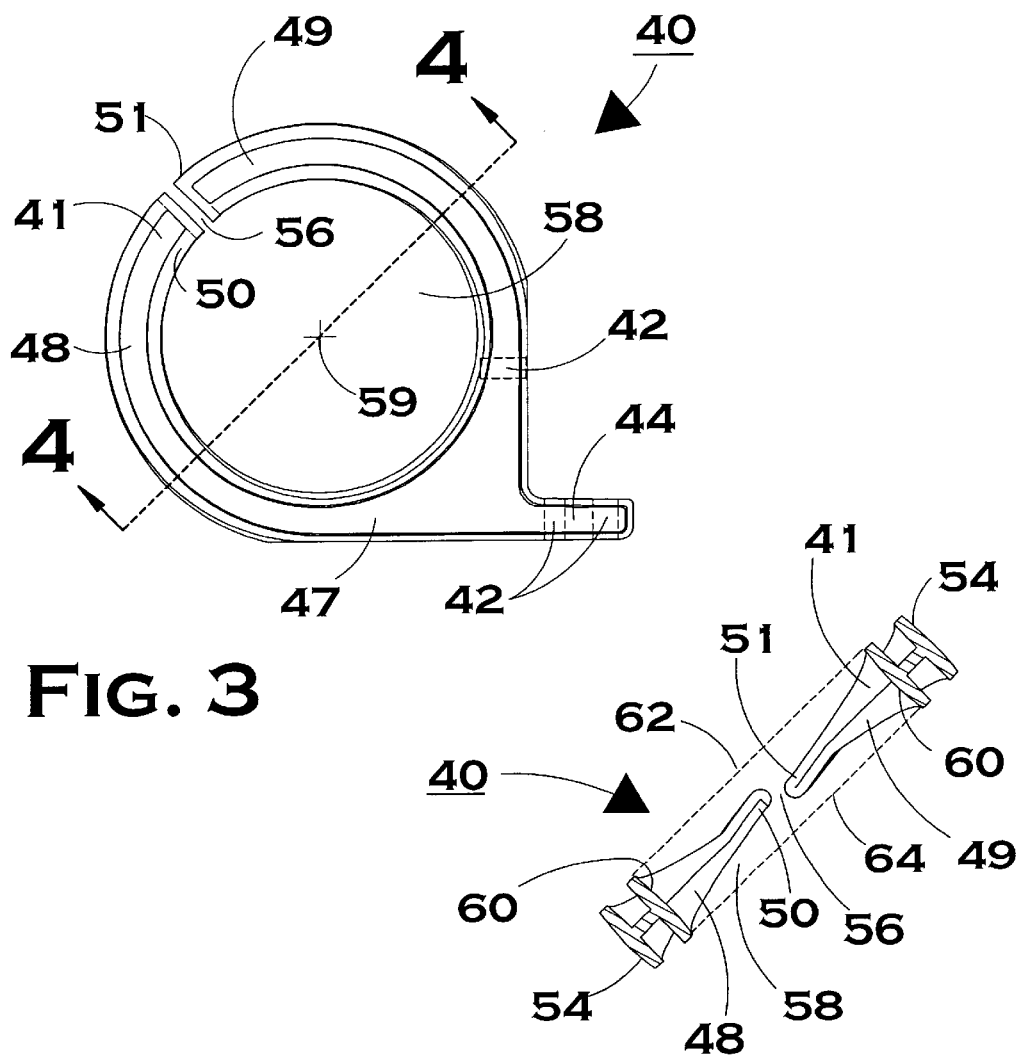
FIG. 3 is a top plan view of the cable ring of FIG. 2.
FIG. 4 is a fragmentary cross-sectional view of the cable ring of FIG. 3 taken along lines 4—4.

FIGS. 2 and 3 are rear perspective and top elevational views, respectively, of a pivoting retention bracket 40 for use with the pivotable cable ring wire management system of FIG. 1. Each retention bracket 40 includes a circular, bifurcated O-ring 41 and an attachment means for securing the O-ring 41 to the mounting member 20. The O-ring 41 is formed from a resilient plastic which may be deformed by applying force but which returns to its original shape as soon as the force is eliminated. As shown, the O-ring 41 is substantially round or circular in shape and includes a proximate base portion 47 and two arcuate ring sections 48, 49 extending from the base portion 47. A distal arcuate tip 50, 51 extends from each ring section 48, 49.

FIG. 4 is a fragmentary cross-sectional view of the cable ring of FIG. 3 taken along lines 4—4. As shown therein and in FIG. 2, the respective tips 50, 51 are slightly angled relative to their respective ring sections 48, 49. A narrow gap 56 is created at the separation point between the distal ends of the respective tips 50, 51. The gap 56 may be as wide or as narrow as desired and as is commercially practical, although for many applications the gap 56 may be designed to be narrower than the most slender wire 70 to be installed within the O-ring 41. It should be obvious that the tip lengths and the angles of the tips 50, 51 relative to the rest of the ring sections 48, 49 may be chosen such that the distal ends or sides of the respective tips 50, 51 may actually contact each other, thereby reducing the effective size of the gap 56 to zero, depending upon the application, or to extend alongside each other in an overlapping configuration, thus causing the gap between the tips 50, 51 to disappear entirely when viewed from the perspective of FIG. 3. Also, although wider gaps 56 may be used without departing from the scope of the present invention, some of the beneficial effects of the present invention will be maximized by minimizing the size of the gap 56 when viewed from the perspective of FIG. 3, as will become apparent hereinbelow.

Collectively, the base portion 47, the ring sections 48, 49 and the tips 50, 51 define a circular or cylindrical O-ring interior 58 through which one or more wires, cables and the like (usually generically referred to herein as "wires") 70 may be routed. The circle or cylinder thus formed defines a central axis 59 upon which the O-ring is centered. Each retention bracket 40 is disposed on the rack 10 such that its central axis 59 is substantially parallel to the axis of rotation 19 of the gate frame 16, and in one preferred embodiment the two axes are both substantially vertical. Further, the base portion 47, the ring sections 48, 49 and the tips 50, 51 may collectively extend in a direction generally perpendicular to the axis of rotation 19, although this is of somewhat less importance than the orientation of the central axis 59 of the O-ring.

The attachment means is disposed at or near a location on the O-ring 41 substantially distant from the separation point, and may include more than one feature. One attachment means suitable for use with the present invention is an integrated tab 44 and a plurality of mounting apertures 42, disposed along the tab 44 and the base portion 47 of the O-ring 41, together with appropriate screws or other mounting hardware. The apertures 42 may comprise an unthreaded receptacle if the screw is of the self-tapping type, and may comprise an aperture of suitable dimensions to permit an industry-standard machine screw such as the #12–24 screw, as well as other industry-standard screws such as the #10–24 and M6, to be inserted therethrough and fastened into a threaded aperture 36 on the mounting member 20. Other apertures 42 may also be provided for other surface mounting alternatives. Also, an alternative attachment means suitable for use with the present invention includes a hook tab which may be inserted into a corresponding slot, as disclosed in the commonly-assigned, commonly-pending U.S. patent application Ser. No. 09/803,313, the entirety of which is incorporated herein by reference. Other suitable attachment means will be obvious to one of ordinary skill in the art.

Each ring section 48, 49 includes a plurality of surfaces, some of which face inwardly toward the O-ring interior 58. In order to minimize the possibility of wires 70 passing through the O-ring 41 from being damaged by the surfaces of the O-ring 41, the inwardly-facing surfaces 60 preferably have a convex shape to help ensure that wires 70 passing over those surfaces are not excessively bent or curved. The convexity may be defined as follows. As discussed previously, the O-ring interior 58 is defined by the 0ring base portion 47, the ring sections 48, 49 and the tips 50, 51. As illustrated in FIG. 4, the open sides of O-ring interior include a first open side 62 and a second open side 64, each of which is substantially circular in shape, as illustrated in FIG. 3. As described hereinafter, wires 70 may be inserted in the O-ring interior 58, thus effectively routing the wires 70 through one open side 62, 64 of the O-ring interior 58 and out the other open side 62, 64. As best illustrated in FIG. 4, the convexity of the inwardly-facing surfaces 60 of the O-ring 41 thus exists between one open side 62 of the O-ring interior 58 and the other open side 64, so that any wire 70 passing through the O-ring interior 58 would contact only a convexly-shaped portion of the O-ring 41. The convexity is preferably selected according to industry-standard recommendations for wire curvatures, commonly known as "bends", which are well known to one of ordinary skill in the art. It should also be understood that the convexity feature of the present invention may also be applied to the inwardly-facing surfaces 60 of retention brackets 40 of substantially different geometries, including both open and closed configurations and of both symmetrical and asymmetrical design.

FIG. 4 also illustrates a preferred construction of the ring sections 48, 49. The cross-section of each ring section 48, 49 shown in FIG. 4 is "H"-shaped, with the sides of the "H" forming the inwardly- and outwardly-facing surfaces 60, 54 of the ring sections 48, 49. For ease of manufacture, or if the outwardly-facing surfaces 54 are to come in contact with wires 70 as well, the outwardly-facing surfaces 54 may be convexly-shaped as well. The other faces of the "H" shape may be flat or otherwise shaped as desired, but the overall structure of a ring section 48, 49 having the "H" shape promotes strength and the ability to return to the ring section's original shape after one or both of the ring sections 48, 49 have been bent or twisted to allow wires 70 to be inserted therein.

Figure 6:
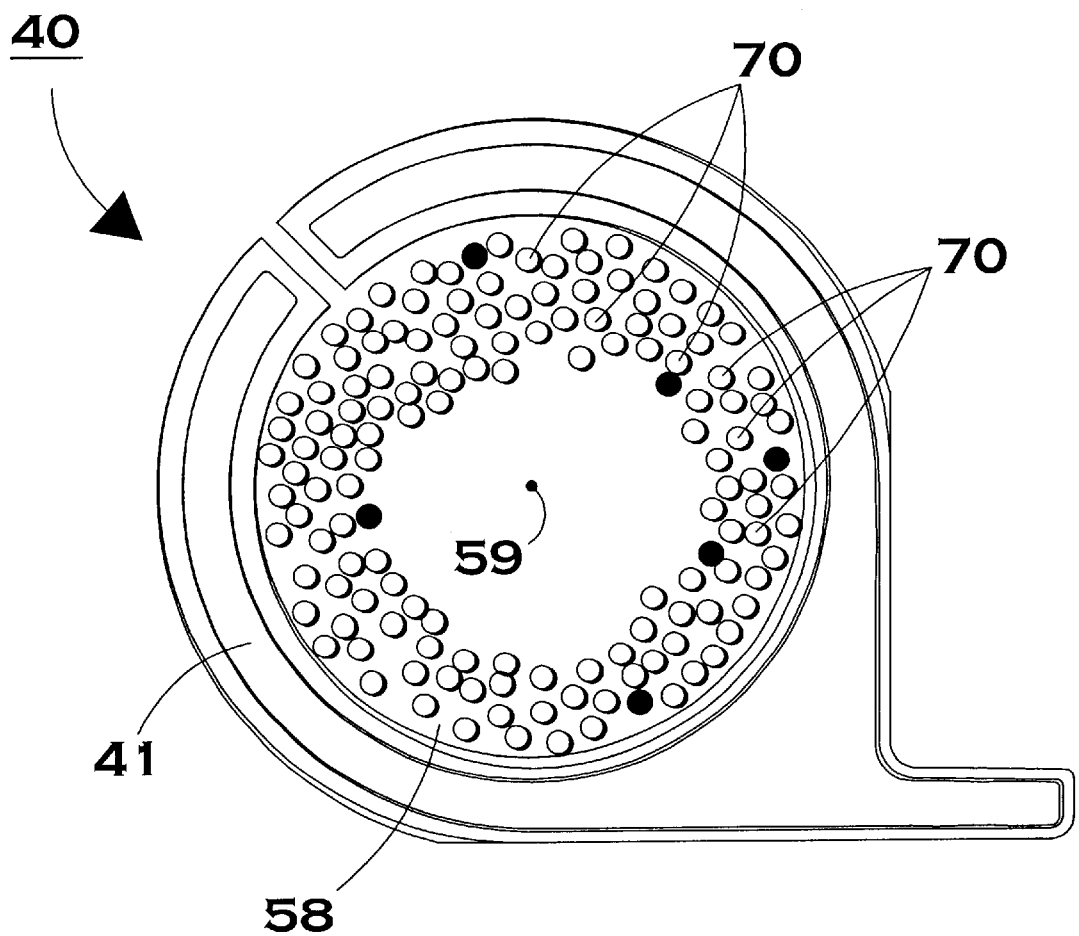
FIG. 6 is a top schematic view of a bundle of cables installed in a first orientation in the cable ring of FIG. 2.
Figure 7:
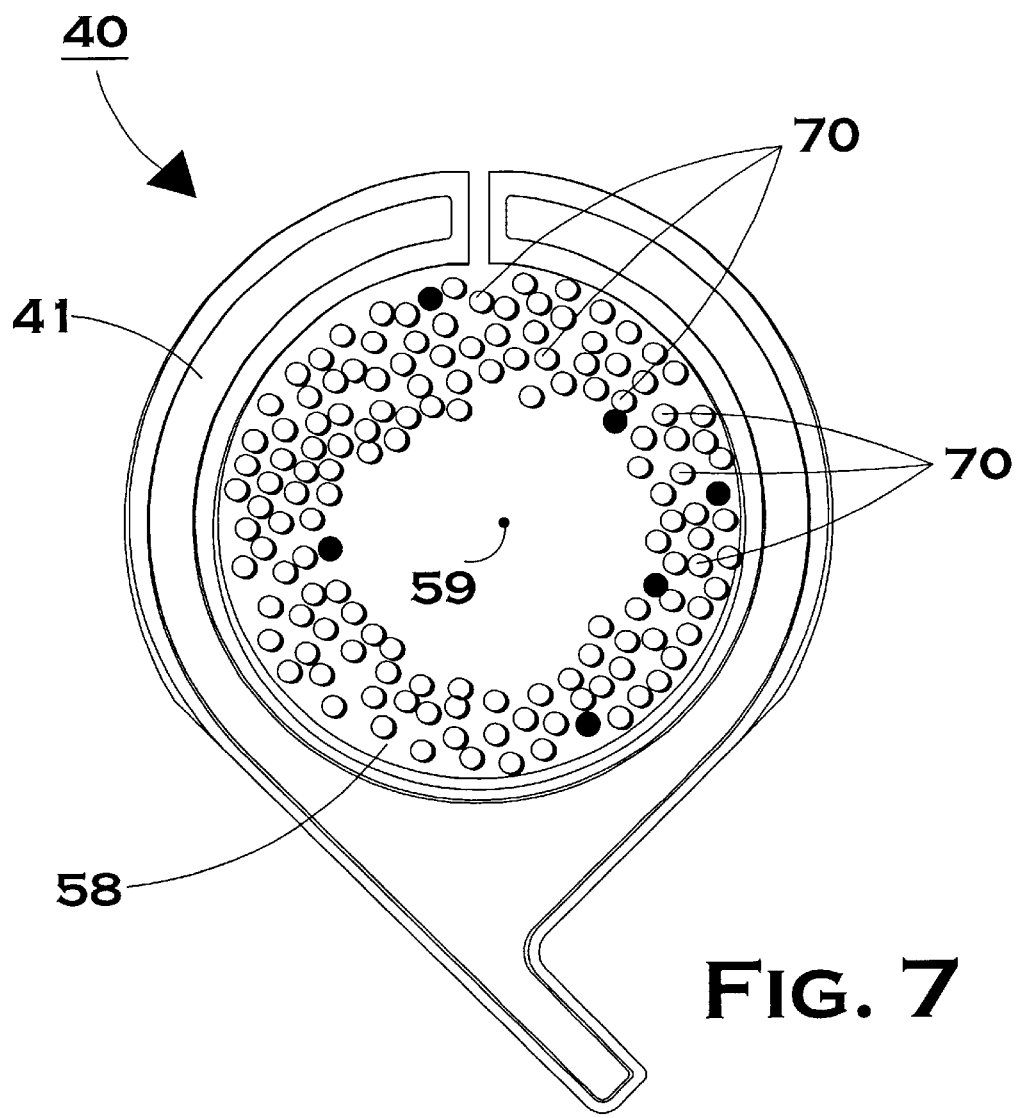
FIG. 7 is a top schematic view of a bundle of cables installed in a second orientation in the cable ring of FIG. 2.

In use, one or more of the retention brackets 40 are mounted to the mounting member 20, which as noted previously may be a portion of the electrical component rack 10 or another suitable structure which is attached to the rack 10. Once one or more retention brackets 40 are attached, an installer may choose to route wires 70 through the respective O-rings 41. Though only one such wire 70 is illustrated in FIG. 1, it should be understood that large numbers of wires 70 may be similarly disposed in the retention bracket 40, as illustrated in FIGS. 6 and 7. If at least one end of a wire 70 remains unconnected, that wire end may simply be inserted through the interior 58 formed by the O-ring 41. However, wires 70 which are already connected at both ends may be installed within an O-ring 41 as follows. First, pressure may be applied to either or both of the 0ring tips 50, 51, causing the tips 50, 51 to be rotationally deflected, and twisting the respective shafts 48, 49 and possibly the base portion 47 as well. Thus, in the embodiment illustrated, when upward pressure is applied to the first tip 50, when downward pressure is applied to the second tip 51, or both, the narrow gap 56 between the tips 50, 51 becomes considerably wider. Once the wire 70 has been maneuvered through the gap 56 and resides in the O-ring interior 58, the tips 50, 51 may be released, allowing all of the O-ring members to return to their respective positions.

As described previously, the O-ring 41 may be formed from a resilient plastic which may be deformed by applying force but which returns to its original shape as soon as the force is removed. In particular, the O-ring 41 may preferably be constructed such that the amount of force required to vertically displace either of the tips 50, 51 is relatively small compared to the amount of force required to horizontally displace the tips 50, 51, either relative to each other or relative to the base portion 47. One suitable construction is illustrated in FIG. 4, wherein the cross-section of each member of the 0ring 41 is generally H-shaped. As shown in FIG. 3, the width of each of the ring sections 48, 49 is relatively uniform, but as shown in FIGS. 2 and 4, the thickness of each of the ring sections 48, 49 is tapered from approximately its junction with the base portion 47 to its respective tip 50, 51. Because the forces exerted on the O-rings 41 by wires 70 that are routed through the O-ring interior 58 tend to be largely directed in the horizontal direction rather than the vertical direction, the described construction is thus able to generally resist the larger forces placed on the members of the O-ring 41 by the wires 70 while still enabling the O-ring tips 50, 51 to be easily manipulated by a user to insert or remove wires 70 to or from the O-ring interior 58 using a relatively small amount of force.

Figure 5:
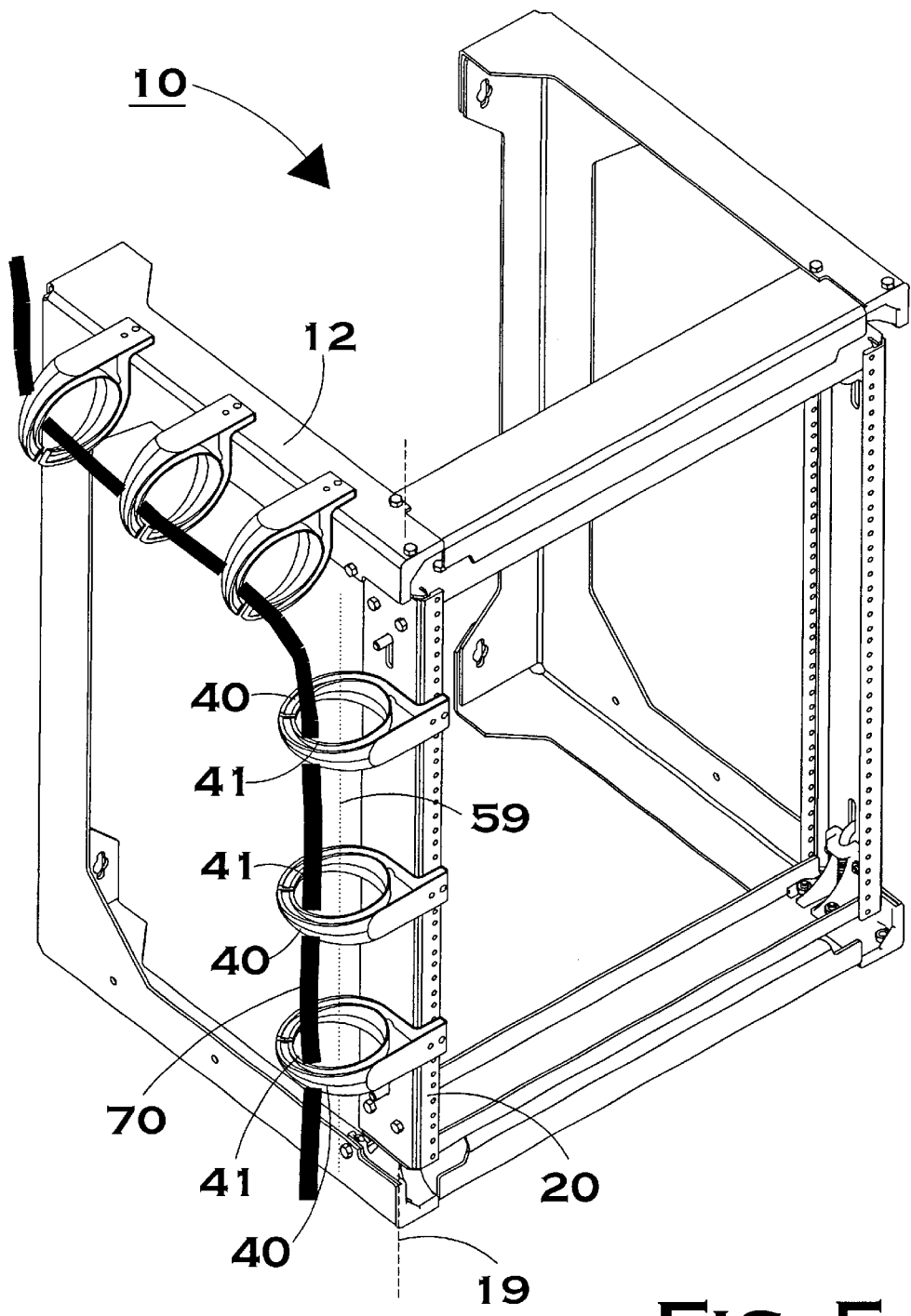
FIG. 5 is a perspective view of a pivotable cable ring wire management system in a closed position in accordance with the present invention.

Once a plurality of wires 70, sometimes collectively referred to herein as a "bundle," is installed in a wire arrangement in the O-ring interior 58, the bundle 70 may be rotated about the axis of rotation 19 of the gate frame. FIGS. 1 and 5 are perspective views of the pivotable cable ring wire management system shown in an open and a closed position, respectively. As shown, the mounting member 20 may be pivoted relative to the stationary support structure 12 about the axis 19, causing the retention brackets 40 attached to the mounting member 20 to be rotated relative to the axis 19 as well. As the retention brackets 40 move between the open position shown in FIG. 1 and the closed position shown in FIG. 5, the wires 70 contained therein must move as well. However, because the O-ring 41 is circularly-shaped, the retention bracket 40 rotates around the bundle of wires 70 while the angular orientation of the wires 70 relative to the stationary support structure 12 remains substantially constant. FIGS. 6 and 7 are top schematic views of a bundle of cables installed in two different orientations in the cable ring of FIG. 2. The two views correspond to the position of the pivoting retention brackets 40 in FIGS. 5 and 1, respectively. As illustrated therein, each pivoting retention bracket 40, but not the wire bundle 70, rotates about its central axis 59 as the mounting member 20 is pivoted back and forth relative to the stationary support structure 12 about the axis of rotation 19.

Further, the disposition of each of the various wires 70 in the bundle relative to the other wires 70 also remains constant, as illustrated by FIGS. 6 and 7. Thus, although the bundle of wires 70 as a whole is moved in an arcuate direction, as shown in FIGS. 1 and 5, the wires 70 are neither severely twisted nor displaced relative to each other during the movement. Although some small amount of twisting may occur, and although additional bending of the wires 70 may occur as a result of the movement, the twisting will be distributed over a larger portion of each wire 70 and the overall deformation of the wires 70 will not be as great as with previously known wire management systems.

In view of the foregoing, it will also be apparent that by minimizing the gap 56 between the tips 50, 51 of the ring sections 48, 49, or by overlapping the tips 50, 51, the uniformity of the shape of the O-ring 41 ring when viewed from the perspective of FIG. 3 would be further enhanced. Although not illustrated, when the O-ring 41 forms a perfect circle, there are no irregularities along the inwardly-facing surfaces 60 of the ring sections 48, 49, thus permitting the O-ring 41 to rotate smoothly around a wire bundle 70 retained therein. If the gap 56 between the tips 50, 51 of the ring sections 48, 49 is increased, then there is a greater likelihood that as the O-ring 41 rotates, one or more wires 70 may become snagged by the irregularity thus created in the shape of the inwardly-facing surfaces 60 of the O-ring 41. By minimizing that gap 56, the likelihood of the O-ring 41 rotating smoothly around the bundle 70 is increased.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A pivotable wire management system for moveably supporting wires on a stationary support structure, the wire management system comprising:
    a mounting member pivotably attachable to a stationary support structure, wherein the mounting member is pivotable relative to the stationary support structure about an axis of rotation; and
    at least one retention bracket extending from the mounting member, the retention bracket including a substantially circularly-shaped cable ring, wherein the circular shape of the cable ring defines a central axis, and wherein the axis of rotation and the central axis are generally parallel.

2. The wire management system of claim 1, wherein the axis of rotation and the central axis are both generally vertical.

3. A pivotable wire management system for moveably supporting wires on a stationary support structure, the wire management system comprising:
    a mounting member pivotably attachable to a stationary support structure, wherein the mounting member is pivotable relative to the stationary support structure about an axis of rotation; and
    at least one retention bracket extending from the mounting member, the retention bracket including a substantially circularly-shaped cable ring, wherein the cable ring defines a generally cylindrical interior defining a central axis, and wherein the axis of rotation and the central axis are generally parallel.

4. A method for repositioning a plurality of wires relative to a stationary support structure, the method comprising the steps of:
    supporting a circular retention bracket on a mounting member;
    positioning a plurality of wires in the circular retention bracket in a wire arrangement, the wire arrangement defining an angular orientation; and
    moving the wire arrangement relative to the stationary support structure by pivoting the mounting member, relative to the stationary support structure, such that the circular retention bracket is rotated around the wire arrangement without rotating the wires.

5. The method of claim 4, wherein the circular retention bracket defines a central axis, and wherein the step of rotating the circular retention bracket around the wire arrangement without rotating the wires includes rotating the circular retention bracket without rotating the wires relative to the central axis.

6. A method for repositioning a plurality of wires relative to a stationary support structure, the method comprising the steps of:
    supporting a circular retention bracket on a mounting member, wherein the circular retention bracket defines a central axis;
    positioning a plurality of wires in the circular retention bracket in a wire arrangement, the wire arrangement defining an angular orientation; and
    moving the wire arrangement relative to the stationary support structure by pivoting the mounting member, relative to the stationary support structure, such that the wire arrangement is moved in an arcuate direction without rotating the wires relative to the central axis.

7. A swing-gate type mounting rack for supporting at least one electrical component and at least one wire, the rack comprising:

a stationary frame assembly;

a gate frame attached to the stationary frame assembly, wherein the gate frame is pivotable relative to the stationary frame assembly about a substantially vertical axis of rotation; and a circular cable ring extending from the gate frame, the circular shape of the cable ring defining a central axis, wherein the central axis is substantially vertical.

8. The mounting rack of claim 7, wherein the central axis defined by the circular cable ring remains substantially vertical while the gate frame and the cable ring are rotated relative to the stationary frame assembly.

9. The mounting rack of claim 7, wherein the cable ring includes two oppositely-facing open sides for accommodating the routing of wires therethrough, wherein the cable ring includes an inner surface disposed to face and make contact with wires retained therein, and wherein at least part of the inner surface is convex from one open side of the retention bracket to the other open side of the retention bracket.

10. The mounting rack of claim 7, wherein the stationary frame assembly is adapted to be attached to a wall.

* * * * *